(12) United States Patent
Mueller et al.

(10) Patent No.: US 7,131,845 B2
(45) Date of Patent: Nov. 7, 2006

(54) ACCESS SECURITY DEVICE FOR DISTRIBUTION MODULE

(75) Inventors: Manfred Mueller, Berlin (DE); Antony Nijhuis, Modautal-Brandau (DE)

(73) Assignee: ADC GmbH, Berlin (DE)

( * ) Notice: Subject to any disclaimer, the term of this patent is extended or adjusted under 35 U.S.C. 154(b) by 0 days.

(21) Appl. No.: 10/506,337

(22) PCT Filed: Feb. 21, 2003

(86) PCT No.: PCT/EP03/01787

§ 371 (c)(1), (2), (4) Date: Apr. 27, 2005

(87) PCT Pub. No.: WO03/077623

PCT Pub. Date: Sep. 18, 2003

(65) Prior Publication Data

US 2005/0221630 A1    Oct. 6, 2005

(30) Foreign Application Priority Data

Mar. 8, 2002 (DE) ............................... 102 10 382

(51) Int. Cl.
*H01R 29/00* (2006.01)
(52) U.S. Cl. ......................................................... 439/49
(58) Field of Classification Search .................. 439/49, 439/409, 417, 410, 412, 395, 387, 391, 620, 439/502, 189, 719
See application file for complete search history.

(56) References Cited

U.S. PATENT DOCUMENTS

| 5,367,011 | A |   | 6/1997 | Meyerhoefer et al. |
| 5,637,011 | A | * | 6/1997 | Meyerhoefer et al. ...... 439/409 |
| 5,740,685 | A |   | 4/1998 | Daoud |
| 6,095,867 | A | * | 8/2000 | Brandt et al. ................ 439/620 |
| 6,175,483 | B1 | * | 1/2001 | Matsubara ................... 361/119 |
| 6,179,644 | B1 | * | 1/2001 | Adams et al. .............. 439/387 |

FOREIGN PATENT DOCUMENTS

| DE | 35 09 523 | 9/1986 |
| DE | 195 20 010 | 9/1996 |
| DE | 198 07 293 | 10/1999 |
| EP | 0 883 304 | 12/1998 |
| GB | 2 237 055 | 4/1991 |

* cited by examiner

*Primary Examiner*—J. F. Duverne
(74) *Attorney, Agent, or Firm*—Merchant & Gould P.C.

(57) ABSTRACT

Disclosed is a device for securing access to two distribution modules (1) used in telecommunication and data technology. Each distribution module (1) is provided with at least one system end (11) and one user end (12). Each connection end (11, 12) is provided with at least one series of insulation-piercing-contact elements. The distribution modules (1) are mounted on a frame (2). At least one access to the system ends (11) is secured by at least one locking device (3, 6) and at least one access to the user ends (12) is secured by at least one locking device (3, 6). The access lock to the user end (12) of at least one distribution module (1) can be unlocked independently of the other distribution modules (1).

22 Claims, 4 Drawing Sheets

ACCESS SECURITY DEVICE FOR DISTRIBUTION MODULE

Figure 1:
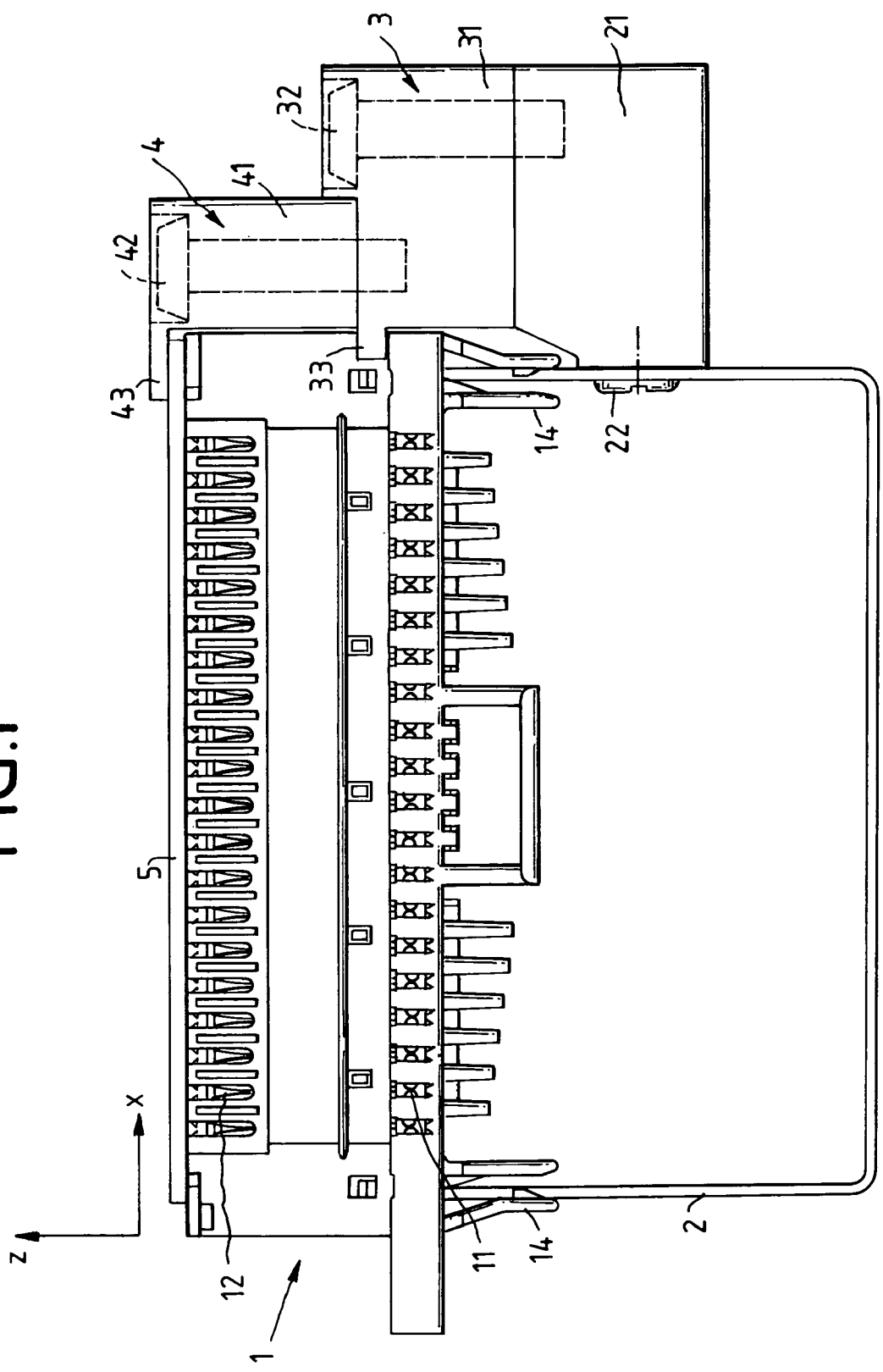

The invention relates to a device for guarding distributor modules of telecommunications and data systems equipment against unauthorized access.

Distributor modules are designed for connecting system and subscriber cables by two terminal sides with in each case one row of insulation-displacement contacts and one row of center taps, with two insulation-displacement contacts being respectively assigned to the system side and the subscriber side on a center tap. Known distributor modules are terminal, connecting, isolating or ground-wire blocks, which are distinguishable on the basis of the configuration of the center taps. Protective and/or test plugs, in particular magazines for overvoltage protection, can be fitted into the center taps of the distributor modules. It is known to arrange distributor modules in a distribution box and protect the latter against unauthorized access by a suitable closure device. When the distribution box is open, however, both sides are unprotected against access.

It is known, for example from DE 198 07 293 C1, to mount two terminal blocks with in each case two parallel rows of insulation-displacement contacts on a base plate in parallel in such a way that the two system sides lie on the inside, and to provide means in the form of a cable duct with a lockable covering, with longitudinal edges angled away in a U-shaped form, for guarding the system cable, which are connected to the inner rows of the insulation-displacement contacts of the two terminal blocks. On account of the required arrangement of the distributor modules and the necessary space requirement, however, a guard of this type is not feasible in the case of a large number of applications. Moreover, an additional independent guard of the subscriber side is not provided in the case of such a device.

A large number of applications requires additional access authorization of the subscriber sides. In particular, if a number of distributor modules are arranged in a common distribution box, with a large number of different subscribers accessing the respective subscriber sides of the distributor modules, an additional guard against unauthorized access to the subscriber sides is necessary.

The invention is therefore based on the technical problem of providing a device by which access authorization to distributor modules can be regulated when there are a large number of subscribers.

The access to at least two distributor modules of telecommunications and data systems equipment, with each distributor module being formed with at least one system side and at least one subscriber side, each terminal side being formed with at least one row of insulation-displacement contact elements and it being possible for the distributor modules to be mounted on a mounting frame, can be regulated by a device which comprises a first locking device, which guards access to the system sides, and is formed with at least a second locking device, which guards access to the subscriber side, with the access guard for the subscriber side of at least one distributor module being unlockable independently of the other distributor modules.

The first and second locking devices are in this case configurable as a component which can be moved into a large number of blocking positions, with access to all terminal sides being blocked in a first position, access to the system sides being possible for an authorized person in a second position and the subscriber side of a distributor module being respectively accessible to an authorized user in further positions.

If the distributor modules are provided in an environment in which access by persons other than the persons authorized to access at least one terminal side is to be ruled out, it is sufficient to block the unauthorized access to the other terminal side by a locking device. In this way, for example, the access to individual subscriber sides or all the subscriber sides of the distributor modules of a common distribution box can be granted with a guard of the system sides which is independent thereof.

In a further embodiment, the locking device is formed by a locking bar and a screw, the screw of the locking bar being arrestable in a blocking position. The screw is in this case preferably formed with a special head, so that unlocking is possible only with a special tool by authorized persons. However, it is also conceivable to block unauthorized movements of the locking bar by codings and/or closing devices.

In a further embodiment, each distributor module can be securely connected to the mounting frame by a respective locking device. The mounting frame is in this case preferably formed as a mounting bracket for latching on ten distributor modules. However, other embodiments of the mounting frames, for example as two-row or three-row profiled frames with round bars, are also conceivable. If a plurality of distributor modules are mounted on a mounting frame, the distance between the individual distributor modules is very small, in favor of a compact type of construction. The distributor modules may be configured as angled blocks, i.e. the terminal sides are at an angle of 90 degrees in relation to one another. Access to the inner terminal side of the angled block is not possible without removing the corresponding distributor module. Consequently, such a locking device allows access to one terminal side to be blocked, while the second terminal side remains freely accessible.

In another embodiment, the distributor modules can be securely connected to the mounting frame by at least one common locking device. By guarding a plurality of distributor modules by a common locking device, few components are necessary. This may be advantageous with respect to production costs.

In a preferred embodiment, the locking bar positively engages in the distributor modules by means of a spike. The spike prevents removal of the distributor module. The arrestment of the locking bar is ensured by the screw.

To convert the access guard to already existing components, and for low-cost production of future components, it is expedient to attach to the mounting frame a block which can be fabricated in a separate production process and by which the locking device can be securely connected to the mounting bracket.

In a preferred embodiment, the access to one terminal side can be guarded by a plate frame, with the plate frame being arrestable by the locking device. This makes it possible, for example, for access to distributor modules which are formed with two parallel terminal sides to be guarded by in each case two plate frames, which are respectively arrestable by a locking device of their own. The access to the outer terminal side of angled blocks can preferably also be guarded by such a locking device with plate frames.

The distributor modules are formed with a row of center taps, in which preferably magazines for overvoltage protection can be fitted, with at least access to the subscriber side being blocked when a magazine is fitted. In a further embodiment, removal of the magazine, and consequently access to the subscriber side, can be guarded by a locking device.

In a preferred embodiment, the distributor modules can be securely connected to the mounting frame by first locking devices, the distributor modules being formed as angled blocks. Since the system side is covered by a respectively neighboring angled block, they are guarded in this way against access. Access to the subscriber sides can be guarded by further locking devices, it being possible for the locking bars of the second locking devices to be securely connected to the first locking device by the associated screws. The first locking devices are in this case formed either with a common locking bar for common guarding of all the distributor modules against removal, or with separate locking bars for separate guarding of individual distributor modules against removal. The second locking devices either block the movement of a plate frame covering the subscriber side or hinder the removal of a magazine which is fitted on a row of center contacts and likewise covers the subscriber side.

Figure 2:
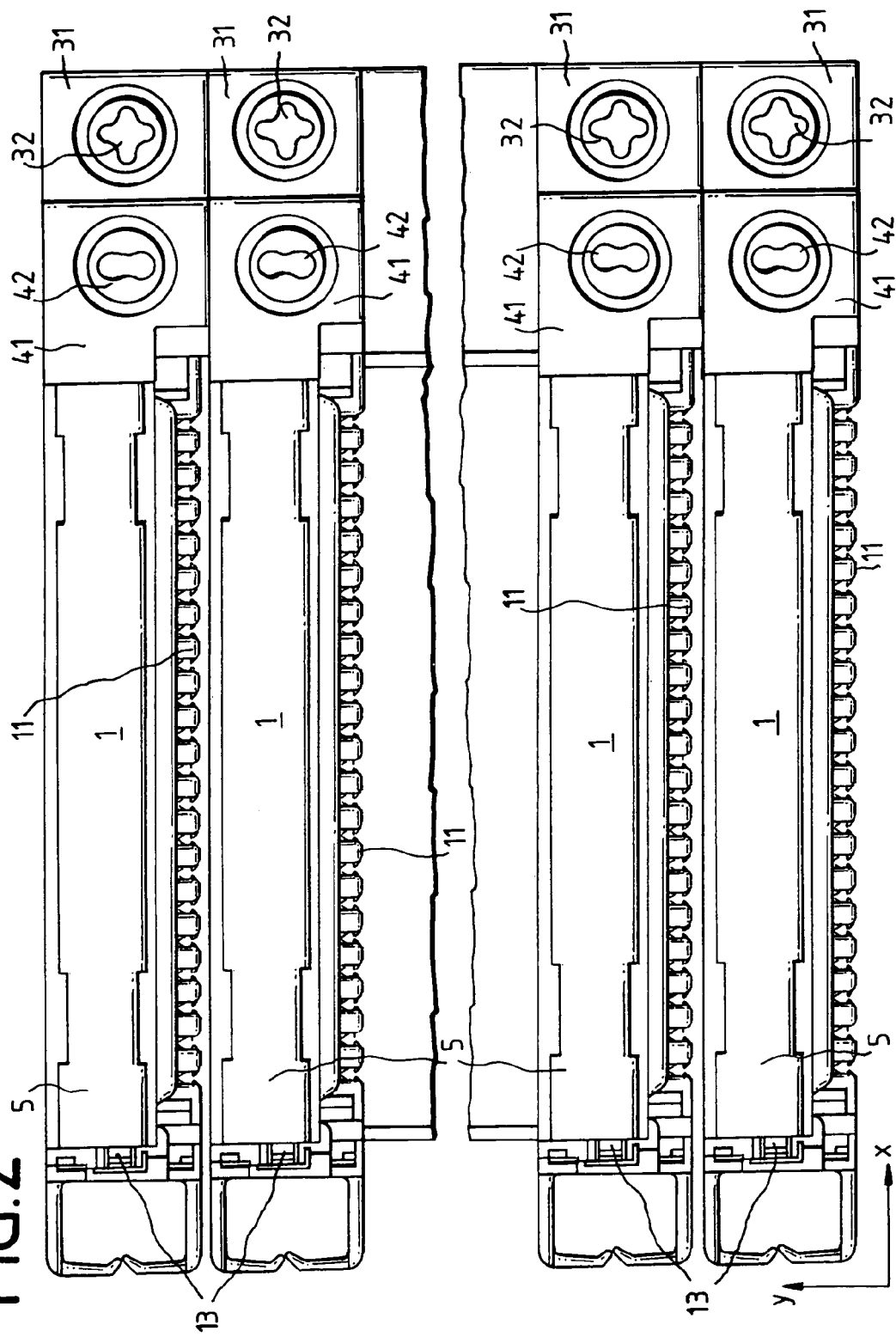
Figure 3:
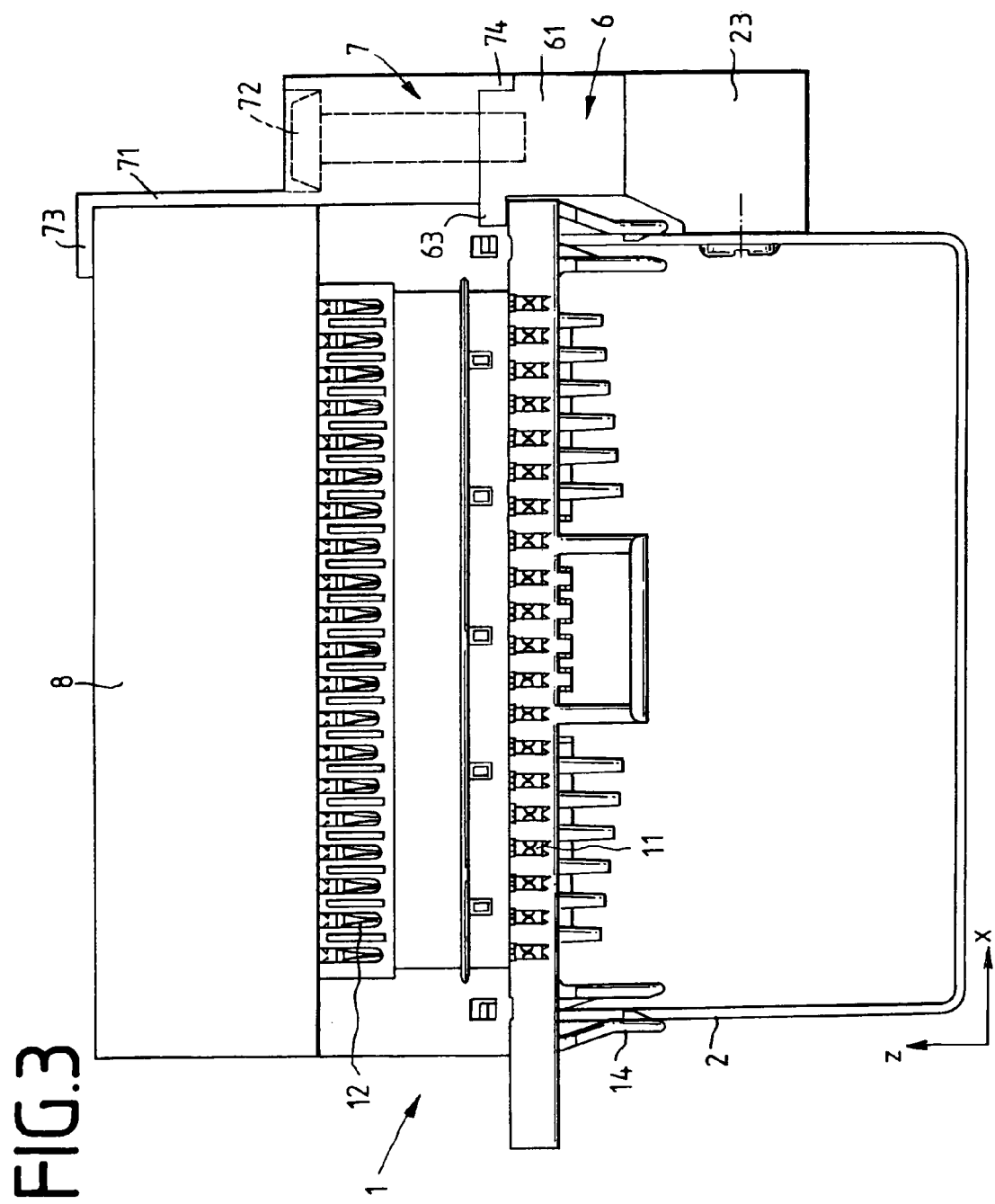
Figure 4:
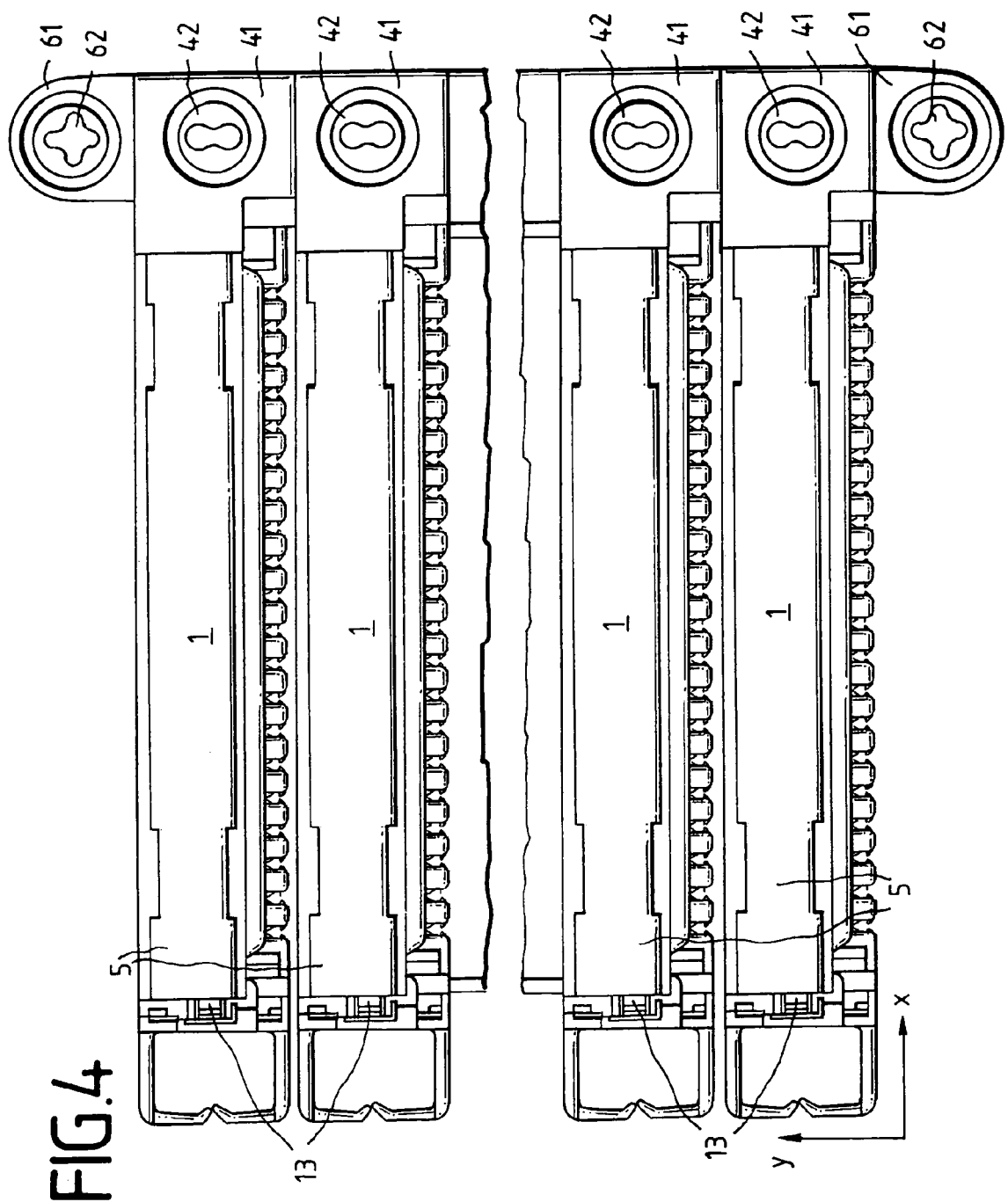

The invention is explained in more detail below on the basis of a preferred exemplary embodiment. In the figures:

FIG. 1 shows a side view of a first embodiment of an access guard for distributor modules, FIG. 2 shows a plan view of the first embodiment, FIG. 3 shows a side view of a second embodiment of the access guard for distributor modules with a fitted magazine and FIG. 4 shows a plan view of the second embodiment without a magazine.

FIG. 1 shows in side view a distributor module 1, a mounting frame 2, configured as a mounting bracket, and a first embodiment of an access guard for ten distributor modules, comprising a first locking device 3 and a second locking device 4. The distributor module 1 is latched on the mounting frame 2 by means of plug-in connections 14. The access direction for removal is the z direction. The distributor module 1 is formed with a system side 11 and a subscriber side 12, which form an angle of 90 degrees. The locking device 3 comprises a locking bar 31 and a slotted screw 32, shown concealed, by which the locking bar 31 is arrested in the position represented. The locking bar 31 is formed with a spike 33, which engages in a groove of the distributor module 1. Removal of the distributor module 1 is blocked by the locking device 3. The subscriber side 12 is covered by a hinge-mounted plate frame 5. The plate frame 5 is blocked against movement by an angle 43 of a locking bar 41. The locking bar 41 is arrested by a screw 42, shown concealed, in the position represented. The locking bar 41 and the screw 42 form the locking device 4. A block 21 is fastened to the mounting frame 2 by means of a screwed connection 22. Instead of the screwed connection 22, other types of fastening, for example riveted, adhesively bonded or soldered connections, are also conceivable. Machined into the block 21 are ten threads for receiving the ten slotted screws 32 of the locking devices 3 of the ten distributor modules 1. The locking device 3 can also be screwed directly to the mounting frame 2. However, an embodiment of this type requires rather more complex production of the mounting frame 2 and/or an access direction to the locking device 3 that deviates from the z direction, so that the embodiment represented is to be preferred when using a block 21.

FIG. 2 shows a plan view of four distributor modules 1 of the access guard represented in FIG. 1 for ten distributor modules. The elements and designations represented in this case correspond to FIG. 1. The compact type of construction makes access to the system sides 11 of the distributor modules 1 possible just by removal of the respective distributor module 1. Removal is blocked by the locking bar 31, which is arrested by the slotted screws 32. Consequently, access to the system sides 11 of the distributor modules is not possible without unlocking by loosening the slotted screws 32. As a result of the way in which the screw heads are formed, the slotted screws 32 can only be loosened by a special tool. This means that access to the system sides 11 is reserved exclusively for authorized persons.

The subscriber sides 12, which cannot be seen in FIG. 2, are covered by plate frames 5. The plate frames 5 are arrested in the position shown by the locking bar 41 and the slotted screws 42. The screw heads of the slotted screws 42 differ in this case both from one another and from the screw heads of the slotted screws 32. Consequently, a subscriber can only unlock access to a single subscriber side 12 of a distributor module 1. The system operator, on the other hand, is authorized to access all the terminal sides. The locking bars 41 are fastened by the slotted screws 42 on the locking bar 31 of the locking device 3. By releasing the locking device 3, consequently the locking device 4 can also be removed. If an operator is to be granted access exclusively to the system sides 11, the locking device 4 can be connected directly to the distributor module 1. The locking device 4 then remains securely connected to a distributor module 1 even when the latter is removed.

For handling, in particular when a plurality of mounting brackets are arranged in a distribution box, it is expedient to arrange the screws 32, 42 in the axial direction represented, so that access takes place in the z direction. However, other embodiments with lateral screwing are also possible.

FIG. 3 shows in side view a distributor module 1, a mounting frame 2 configured as a mounting bracket and a second embodiment of the access guard with a common locking device 6 for a plurality of distributor modules 1. For the same elements, the designations corresponding to FIG. 1 are used. In this embodiment, the distributor modules 1 are protected by a common locking device 6 against removal from the mounting frame 2. The locking device 6 comprises the locking bar 61 and slotted screws 62 (not represented), by which the locking bar 61 can be securely connected to a block 23 attached to the mounting frame 2. The block 23 is formed with two threads for receiving the two slotted screws 62 of the locking device 6.

Fitted in a row 13 of center taps (which cannot be seen) of the distributor module 1 is a magazine 8. With the magazine 8 fitted, access to the subscriber side 12 is not possible. The magazine 8 is guarded against unauthorized removal by a locking device 7. The locking device 7 comprises a locking bar 71 and a screw 72. The locking bar 71 is formed with an angle 73, which holds the magazine 8 in the position represented. The locking bar 71 is securely connected to the locking bar 61 by the slotted screw 72, shown concealed. The connection is supported by a positively locking element 74 of the locking bar 71. The slotted screw 72 is formed with a special head, so that release of the locking device 7 for removal of the magazine 8 and/or access to the subscriber side 12 of the distributor module 1 is possible only by authorized persons with a special tool. The fitting of a magazine 8 or the use of a plate frame 5 for guarding access to the subscriber side 12 is independent of the way in which removal of the distributor modules 1 is guarded by a common locking bar 61 according to FIG. 3 or separate locking bars 31 according to FIG. 1. A combination of a distributor module 1 with a magazine 8 and a distributor module 1 without a magazine 8 in a mounting frame 2 is also conceivable.

FIG. 4 shows a plan view of the second embodiment of the removal guard according to FIG. 3, without fitting of the magazine 8 represented in FIG. 3. The designations correspond to FIG. 3. Without a fitted magazine 8, access to the subscriber side 12, concealed in FIG. 4, is guarded by the plate frame 5 and the associated locking device 4 in a way corresponding to FIGS. 1 and 2.

The locking bar 61 for guarding the system sides 11 is fastened by means of two screws 62 on the block 23, which cannot be seen. An advantage of this embodiment is the more compact type of construction in the x direction and a smaller number of necessary locking elements. A disadvantage, however, is the additional space requirement in the y direction. Access to the subscriber side 12, shown concealed, can be granted exclusively to authorized persons by the corresponding tool for unblocking the locking device 4 and/or 7, without at the same time releasing the blocked access to the system side 11 of the corresponding distributor module 1. By unblocking the locking device 6, the locking bar 61 is movable. The locking bars 41 are securely connected to the locking bar 61 by the slotted screws 42 and can therefore be removed with the latter. Instead of the connection represented to the locking bar 61, it is also conceivable to connect the locking bar 41 directly to the distributor module 1 by the slotted screw 42. Such a connection allows separate guarding of the subscriber sides 12 of each subscriber module 1 even with a common locking device 6.

If a subscriber is authorized access to a plurality of subscriber modules 1, it is expedient to use slotted screws 42 and/or 72 with the same screw heads for the locking devices 4 and/or 7 of these distributor modules 1. If a subscriber is authorized access to a series of distributor modules 1, the locking device 4 can be modified in such a way that the altered locking bar 41 covers a plurality of plate frames 5.

If a multiplicity of subscriber modules 1 are arranged in a distribution box and access to this distribution box is required exclusively for the system operator and a further subscriber, the locking device 3 and/or 6 are sufficient for protection of the system sides 11 and a locking device on the distribution box is sufficient for common protection against unauthorized access of the subscriber sides 12 of the distributor modules 1.

LIST OF REFERENCE NUMERALS 1 distributor module
2 mounting bracket
3 locking device
4 locking device
5 plate frame
6 locking device
7 locking device
8 magazine
11 system side
12 subscriber side
13 row of center taps
14 plug-in connection
21 block
22 screwed connection
23 block
31 locking bar
32 slotted screw
33 spike
41 locking bar
42 slotted screw
43 angle
61 locking bar
62 slotted screw
63 spike
71 locking bar
72 slotted screw
73 angle
74 positively locking element

The invention claimed is:

1. A device for guarding access for at least two distributor modules of telecommunications and data systems equipment, with each distributor module being formed with at least one system side and at least one subscriber side, each side being formed with at least one row of insulation-displacement contact elements, the distributor modules mounted on a mounting frame comprising an access guard, wherein access to the system sides is guarded by at least one first locking device of the access guard, wherein access to the subscriber sides is guarded by at least one second locking device of the access guard, with the at least one second locking device for the subscriber side of at least one distributor module being unlockable independently of the other distributor modules.

2. The device as claimed in claim 1, wherein at least one of the first locking device and the second locking device are formed by at least one locking bar and at least one screw.

3. The device as claimed in claim 1, wherein each distributor module is securely connected to the mounting frame by at least one of the first locking device and the second locking device.

4. The device as claimed in claim 1, wherein the distributor modules are securely connected to the mounting frame by at least one common first or second locking device.

5. The device as claimed in claim 2, wherein the locking bar of at least one of the first locking device and the second locking device engages in the distributor modules with at least one spike.

6. The device as claimed in claim 2, wherein the connection of at least one of the first locking device and the second locking device to the mounting frame comprises a block.

7. The device as claimed claim 1, wherein the access to at least one side of the distributor module is guarded by a plate frame, with the plate frame being arrestable by one of the first and second locking devices.

8. The device as claimed in claim 1, wherein at least one distributor module is formed with a row of center taps, with an access element fitted in the row, and wherein removal of the access element is guarded by one of the first and second locking devices.

9. The device as claimed in claim 8, wherein the access element is a protective element formed as a magazine for protecting against overloading.

10. The device as claimed in claim 2, wherein the distributor modules are securely connected to the mounting frame by the locking device with the distributor modules being formed as angled blocks, wherein access to the subscriber sides is guarded by second locking devices and wherein the at least one locking bar is securely connected to the second locking devices by the at least one screw.

11. An access guard for at least two distributor modules for telecommunications and data systems equipment, each of the at least two distributor modules including at least two terminal sides forming a system side and a subscriber side, each of the at least two terminal sides including a row of insulation-displacement contact elements, the access guard comprising:
    (a) a mounting frame constructed for mounting the at least two distributor modules;
    (b) a first locking device constructed to guard access to the subscriber side of at least one of the at least two distributor modules; and (c) a second locking device constructed to guard access to the system side of at least one of the at least two distributor modules;

(d) wherein access to the subscriber side of one of the at least two distributor modules is unlockable independently of the remaining distributor modules.

12. The access guard of claim 11, wherein at least one of the first and second locking devices is formed by a locking bar and at least one screw.

13. The access guard of claim 12, wherein the locking bar of at least one of the first and second locking devices engages the distributor modules with at least one spike.

14. The access guard of claim 11, further comprising a plate frame positioned to guard access to one terminal side of at least one of the at least two distributor modules.

15. The access guard of claim 14, further comprising an access element configured to guard at least a portion of a terminal side.

16. The access guard of claim 11, wherein each distributor module is connected to the mounting frame by at least one of the first and second locking devices.

17. The access guard of claim 11, wherein the distributor modules are securely connected to the mounting frame by at least one common locking device among the first and second locking devices.

18. The access guard of claim 11, further comprising a block connecting at least one of the first and second locking devices to the mounting frame.

19. The access guard of claim 11, wherein the second locking device is mounted to the mounting frame.

20. A system for guarding access to telecommunications equipment comprising:

(a) at least two distributor modules, each of the at least two distributor modules including at least two terminal sides forming a system side and a subscriber side, each of the at least two terminal sides including a row of insulation-displacement contact elements;

(b) a mounting frame constructed for mounting the at least two distributor modules;

(c) a first locking device constructed to guard access to the subscriber side of at least one of the at least two distributor modules; and (d) a second locking device constructed to guard access to the system side of at least one of the at least two distributor modules;

(e) wherein access to the subscriber side of one of the at least two distributor modules is unlockable independently of the remaining distributor modules.

21. The system of claim 20, further comprising a plate frame positioned to guard access to one terminal side of at least one of the at least two distributor modules.

22. The system of claim 20, wherein the second locking device is mounted to the mounting frame.

* * * * *

UNITED STATES PATENT AND TRADEMARK OFFICE
CERTIFICATE OF CORRECTION

PATENT NO.        : 7,131,845 B2  
APPLICATION NO. : 10/506337  
DATED              : November 7, 2006  
INVENTOR(S)       : Mueller et al.

Page 1 of 1

It is certified that error appears in the above-identified patent and that said Letters Patent is hereby corrected as shown below:

Col. 6, line 37, claim 7: "as claimed claim 1," should read --as claimed in claim 1,--

Signed and Sealed this

Fourth Day of December, 2007

JON W. DUDAS  
*Director of the United States Patent and Trademark Office*